United States Patent [19]
Buchwalter et al.

[11] Patent Number: 5,133,840
[45] Date of Patent: Jul. 28, 1992

[54] SURFACE MIDIFICATION OF A POLYIMIDE

[75] Inventors: Leena P. Buchwalter; Stephen L. Buchwalter, both of Wappingers Falls; Terrence R. O'Toole, Hopewell Junction; Richard R. Thomas, Fishkill; Alfred Viehbeck, Stormville, all of N.Y.

[73] Assignee: International Business Machines Corporation, Armonk, N.Y.

[21] Appl. No.: 523,764

[22] Filed: May 15, 1990

[51] Int. Cl.$^5$ .............................. C25D 5/54; B05D 3/10
[52] U.S. Cl. .................................. 205/167; 205/169; 205/187; 427/301; 427/306; 156/668
[58] Field of Search ............... 204/38.4, 130; 427/306, 427/307; 156/668

[56] References Cited

U.S. PATENT DOCUMENTS

| | | | |
|---|---|---|---|
| 3,361,589 | 1/1968 | Lindsey | 156/319 |
| 4,078,096 | 3/1978 | Redmont et al. | 427/306 |
| 4,517,254 | 5/1985 | Grapentin et al. | 427/306 |
| 4,668,354 | 5/1987 | Levy | 204/130 |
| 4,832,799 | 5/1989 | Knudsen et al. | 204/38.4 |

*Primary Examiner*—John Niebling
*Assistant Examiner*—Kishor Mayekar
*Attorney, Agent, or Firm*—Scully, Scott Murphy & Presser

[57] ABSTRACT

The surface modification of polyimide materials by a chemical process is disclosed to provide a variety of functional groups on the surface. The surface is treated to produce polyamic acid carboxyl groups which are subsequently reacted with epoxies, hydrazines, or alcohols. The carboxyl groups can be also be subjected to other organic reactions, such as reduction with metal hydrides and the like. The versatility and controllability of this process lends itself to promoting adhesion of the polyimide to similarly treated polyimides, other polymers and other substrates as well as combining with metals such as metal catalysts used for depositing conductors on non-conductive surfaces such as circuit boards.

33 Claims, 1 Drawing Sheet

SURFACE MODIFICATION FOR INCREASED COPPER-TO-POLYIMIDE ADHESION USING THE REDUCTIVE SEEDING PROCESS

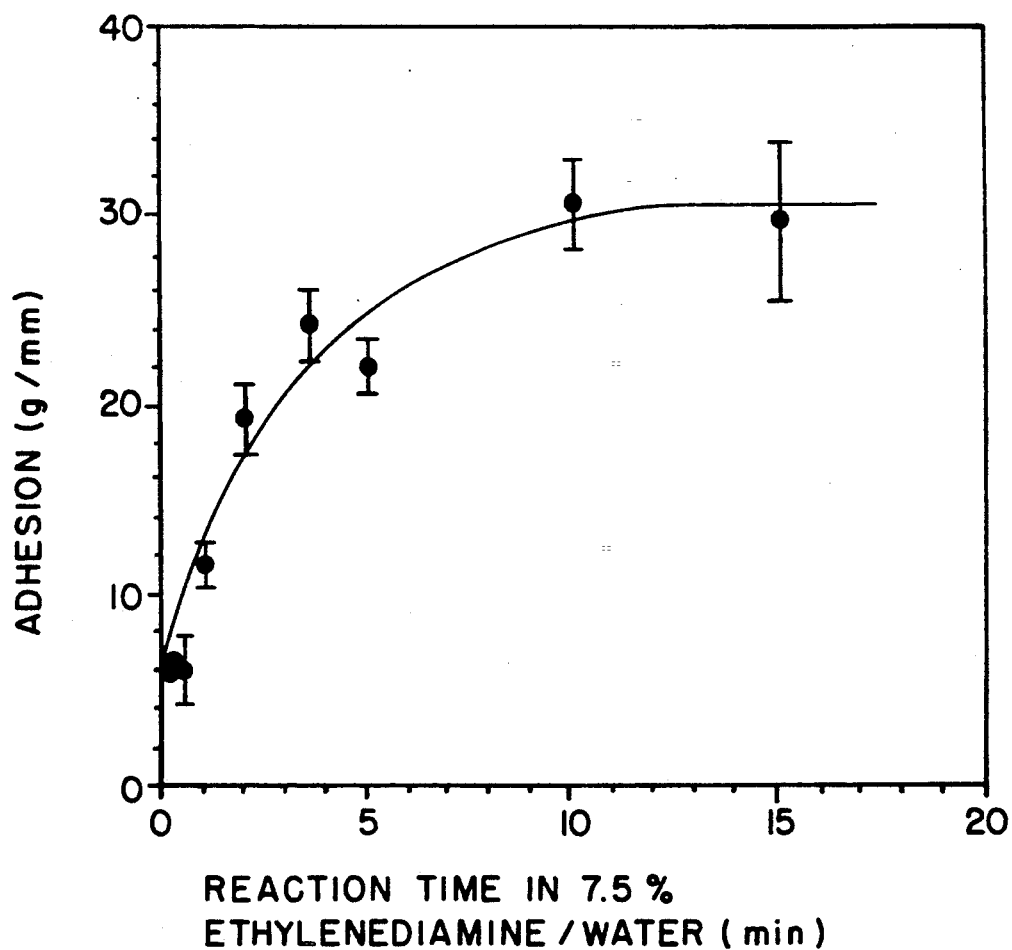
SURFACE MODIFICATION FOR INCREASED COPPER-TO-POLYIMIDE ADHESION USING THE REDUCTIVE SEEDING PROCESS

SURFACE MIDIFICATION OF A POLYIMIDE

DESCRIPTION

1. Technical Field

The present invention relates to a process for the surface modification of polyimide materials by a chemical process to provide a variety of functional groups on the surface. The versatility and controllability of this process lends itself to promoting adhesion of the polyimide to similarly treated polyimides, other polymers and other substrates as well as combining with metals such as metal catalysts used for depositing conductors on non-conductive surfaces such as circuit boards.

2. Prior Art

Lindsey U.S. Pat. No. 3,361,589 describes a method for partially converting a polyimide film surface to a polyamic acid by means of an alkali metal base, neutralizing the surface with a mineral acid and then adhering the film to a substrate. Dunphy et al. U.S. Pat. No. 3,770,573 describes a laminar structure based on a polyamic acid obtained from a polyimide precursor, whereas Grapentin et al. U.S. Pat. No. 4,517,254 describes the adhesive metallization of a polyimide by treating the polyimide with an alkali hydroxide and an organic nitrogen compound such as an amine, followed by the galvanic deposition of a metal salt such as palladium salts and the like. Redmond et al. U.S. Pat. No. 4,078,096 similarly teach the treatment of a polyimide substrate with a mixture of hydrazine and a caustic material followed by the deposition of catalysts on the surface such as a palladium salt and its equivalents. Lastly, Beckenbaugh et al. U.S. Pat. No. 4,261,800 similarly describe the treatment of a polyimide surface with hydrazine or a substituted hydrazine which is subsequently exposed to ultraviolet radiation to render selected areas thereof incapable of reducing an activating metal such as a palladium salt to thereby delineate an unexposed area capable of producing such reduction. Grapentin et al., Redmond et al., and Beckenbaugh et al. all relate to a process for activating a substrate so that an electroless metal coating such as electroless copper can be applied to the surface for the subsequent formation of electric circuit patterns. All three patents describe the treatment of polyimides as distinguished from a polyamic acid polymer surface.

Several studies have already shown that the inherent adhesion between polyimides and electrolessly deposited or evaporated metals such as copper or nickel is not very high. Kowalczyk et al. J. Adh. Sci. Technol. Vol. 2, No. 2, p. 95 (1988). Adhesion improvements have been made by treating the polyimide surface with chemical reagents such as disclosed by Dumas et al. U.S. Pat. No. 4,775,449 and DeAngelo, U.S. Pat. No. 3,791,848. The chemical reaction serves to roughen the polymer surface and/or generate reactive sites which bind to the metal.

CROSS REFERENCE TO A RELATED APPLICATION

According to copending U.S. patent application Ser. No. 07/290,486 filed Dec. 23, 1988 entitled "Method For Conditioning An Organic Polymeric Material" of Viehbeck et al., and assigned to the same assignee as the present invention, certain organic polymeric materials are capable of reversibly accepting or donating electrons from a reducing entity. The redox sites in the polymer accept electrons and, as a result, a change in the properties of the polymer occurs. This change is useful in modifying or etching the polymeric material. The material can be modified by incorporation of metallic seeds into the material at a controlled depth. The seeds are incorporated by interaction of cations of the metals with the redox sites in the polymer, which cause the reduction of the cations to form the neutral metallic seeds. Subsequent exposure of the polymeric material containing the seeds to an electroless bath causes further deposition of metal (having the desirable characteristic of good adhesion to the polymeric material). Etching of the polymeric materials can be carried out as a result of an increase in solubility of the polymer in aprotic solvents when its redox sites have accepted electrons. The increased solubility allows openings to be etched in certain areas of the polymeric material that have been reduced, leaving other areas unchanged.

SUMMARY OF THE INVENTION

The present invention relates to a process and an article of manufacture obtained by such process whereby polyimide surfaces are reacted to obtain free carboxyl groups and in turn these carboxyl groups are used for subsequent organic chemical reactions such as reactions with epoxy compounds, hydrazine compounds and their equivalents, and alcohols. The surface of the polyimide is thereby capable of improved adhesion to other materials such as polymers or metals or sufficiently altered to improve the wettability of the polyimide surface or conversely, its resistance to wetting. A reaction can also be conducted to provide sites for subsequent polymerization reactions.

It has been found that because the amount of carboxyl groups thus formed on the polyimide surface is very low relative to the concentration of reactants in solution, reactants and reaction conditions have to be carefully selected so that the reactions of the surface groups occur in high yield without adversely affecting the bulk of the polyimide and without interference by impurities in the reaction milieu.

The present invention also involves providing a surface of modified redox activity on an electroactive material i.e. a material which can undergo reversible redox reactions such as a polymer and especially a polyimide for depositing catalytic seed metal for electroless plating, such electroless plated surface subsequently being plated by an electro-deposition process.

BRIEF DESCRIPTION OF THE DRAWINGS

The drawing is a graph illustrating the results of providing a surface of modified redox activity on a polyimide subsequently employed for reductive seeding of metal ions.

DETAILED DESCRIPTION

Adhesion to fully cured polyimide compositions is not easily achieved. The prior art, as discussed above, has developed various methods for obtaining adhesion to polyimides by surface modification but does not provide any basic information regarding the nature of surface reactions on polyimides or various other modifications of polyimide surfaces.

Adhesion is especially a problem in the formation of circuit patterns on circuit boards where a polyimide is employed as a substrate.

Methods have been employed to coat polyimides with metals to form a conductive surface such as sputtering or evaporation of an adhesion layer of chromium followed by a thin plating of copper. Although this method is employed and in some instances is a conventional approach to plating polyimides, it is expensive.

Accordingly, a low cost, direct method of applying a metal film such as copper to a polyimide substrate would greatly facilitate development of so-called advanced packaging structures for electrical circuits and especially printed circuits employed in electrical circuit board construction or miniaturization of electrical circuits.

In the manufacture of circuit boards employing polyimide substrates there are some manufacturing procedures that require the surface of the polyimide to have improved wettability e.g. coating resist compositions onto the surface of the polyimide. There are other instances when the polyimide surface would advantageously have the properties of reduced wettability to avoid the dendritic growth of metallic elements on the surface such as copper circuits and especially copper circuits that are coated with tin as an etch resist. Dendritic metal growth, if severe enough could cause short circuiting of the circuit pattern and is especially a problem in microcircuits where copper conductors are spaced in close proximity to one another.

In developing a high-density multilayer polyimide/copper package for microelectronic circuits, several problems are encountered such as low yield, a large number of process steps and low through-put. An advantage could be realized if a plated polyimide/copper package could be developed with a significant reduction on the number of processing steps as well as a selective polyimide seeding process coupled with a full electroless copper metal build process.

There are some prior art processes which provide for the deposition of metal particles such as palladium "seed" onto the surface of polyimide films in which the polyimide surface is chemically reduced and the metal particle are introduced by immersing the reduced polyimide into a non-aqueous solution containing the appropriate metal salt. The adhesion between the electrolessly deposited metal and the polyimide is often poor especially in the case of cured polyimides which have adhesion values of less than 1 g/mm. In some chemically imidized PMDA-ODA polyimides, the adhesion varies unpredictably between samples, sometimes as high as 60 g/mm, while most are less than 10 g/mm.

It is therefore an object of the present invention to overcome these and other difficulties encountered in the prior art.

It is especially an object of the invention to provide an inexpensive method for treating the surface of polyimide materials and especially polyimide substrates for the application of other materials, such as metals and especially metal catalysts for the formation of a conductive surface on the polyimide.

It is also an object of the present invention to treat the surface of a polyimide material as set forth herein, especially employing a wet chemical technique for the surface modification of polyimides to provide a variety of functional groups on the surface and for subsequently bonding to the surface.

It is the further object of this invention to provide a versatile and controllable modification of a polyimide surface which lends itself to the promotion of adhesion of metals as well as similarly treated polymers or other polymers.

It is also an object of the invention to modify the surface of a polyimide so as to avoid dendritic metal growth thereon by formation of a non-wettable surface. It is a further object of the invention to form sites for polymerization of other materials on the surface of the polyimide.

It is also an object of the present invention to provide various methods for changing the surface properties of polyimides so that they may be employed in subsequent manufacturing steps requiring lamination, adhesion, wettability and the like.

It is a further object of the present invention to provide a surface of modified redox activity on a material for the deposition of catalytic metallic seed particles by a redox-mediated process in an electroactive material which can undergo reversible redox reactions such as a polymer and especially a polyimide for the electroless coating of such surface especially where the seed and the subsequent electroless deposit have penetrated the surface and act to anchor metal coatings to the electroactive material.

It is a further object of the present invention to force the electroless metal deposition to begin inside of the electroactive material such as an electroactive polymer at some depth to that the electroless deposit is initiated within the polymer surface so as to anchor the subsequent electroless metal layer to the polymer.

These and other objects are achieved according to the present invention by converting the polyimide surface to carboxyl groups and in turn using these carboxyl groups for subsequent organic chemical reactions or by reacting the surface directly with an amine such a ethylene diamine.

The carboxyl groups thus obtained or as further reacted by means of organic reactions according to the present invention alter the surface properties of the polyimide to improve the ability of the surface to combine with metals or metal salts used for the formation of conductive surfaces on the polymer, or to promote the adhesion of the polyimide surface to other surfaces including polyimides similarly modified or other polymers or substrates and generally to alter the reactivity of the film surface so that it may be employed in subsequent organic chemical reactions.

The various polymers that are especially suitable for the present invention comprise the polyimides which are defined and described in detail in Kirk-Othmer, *The Encyclopedia of Chemical Technology*, 3rd. Ed. Vol. 18, pp. 704-719 which is incorporated herein by reference. These polyimides include Kapton (trademark) polyimides, polyamide imides based on oxy-dianiline and trimellitic anhydride, polyether imides, polyimide siloxanes and poly-bis maleimides.

According to the present invention a variety of functional groups may also be applied to the surface of the polyimide that has been converted to a polyamic acid by means of conducting further reactions with the carboxyl group of the polyamic acid. The functional group that is added to the surface through the carboxyl group can thus be chosen to give a surface tailor-made for whatever purposes, especially adhesion to a particular material. The modification is confined substantially to the surface of the polymer so that the desirable bulk properties of the polyimide are unaffected. The cost advantage of this approach derives from simple immersion (dip) and rinse processing which is characteristic of wet chemical processes. No high-cost vacuum tooling is required unlike methods such as plasma treatment or metal sputtering. Stated otherwise, the present invention provides a method for doing organic chemistry on the surface of the polyimide.

A process is thus provided for hydrolyzing the surface of a polyimide polymer to form a polyamic acid on the surface wherein the polyamic acid contains free carboxyl groups. This is achieved by contacting the surface of the polyimide with a caustic material such as a dilute alkali metal hydroxide solution or an alkaline earth hydroxide, tetraalkylammonium hydroxide solution or any of the organic bases or ammonium hydroxide after which the surface of the film is neutralized with an aqueous inorganic or organic acid solution.

The surface hydrolysis reaction of polyimide has some advantageous features, especially for microelectronic applications. The mild conditions (0.25M NaOH at room temperature) ensure that the hydrolysis is confined to the surface and does not degrade the desirable dielectric bulk properties of the polymer. Also, the surface hydrolysis is reversible, i.e. the reaction merely opens the imide ring--it does not cleave polymer chains. Hence, the amic acid groups can be re-imidized at a later time, if that is desired, by heating the sample to above about 150° C.

Once the carboxyl groups are obtained, they can be subsequently used as reactive groups for a wide variety of reactions for specific applications. Non-limiting examples include reaction with epoxy compounds, reaction with hydrazines, and esterification with hydroxy-functional compounds.

Where the foregoing epoxy hydrazine or hydroxy-functional compounds are polyfunctional, they may be employed to adhere the polyamic acid surface to an adjacent polyamic acid surface or a similar surface having groups that will react with the various polyfunctional compounds. Di-and tri-functional compounds are especially suitable in this regard. The various organic reactions that may be conducted with the carboxyl groups formed as part of the process of the invention are described later but generally can be employed for the foregoing purposes or may in turn be subsequently used in processes described herein to achieve the foregoing purposes.

The various epoxy compounds including mono epoxides and polyepoxides that may be employed according to the present invention comprise:
epichlorohydrin;
ethylene oxide;
propylene oxide;
butylene oxide;
cyclohexene oxide;
cyclopentene oxide;
styrene oxide;
triglycidyl isocyanurate;
epoxidized oil;
hydantoin epoxy resins;
bisphenol A or bisphenol F reaction products with epichlorohydrin;
epoxy cresol novolacs;
epoxy phenol novolacs;
polynuclear phenol-glycidyl ether-derived resins;
cycloaliphatic epoxy resins;
tetraglycidylmethylenedianiline resins;
triazine epoxy resins;
and triglycidyl-p-aminophenol resins and mixtures thereof.

The epoxy compounds that comprise the epoxy resins as listed above are further defined in Kirk-Othmer, *Encyclopedia Of Chemical Technology*, 3rd Edition, Vol. 9, pp. 267–290 which is incorporated herein by reference.

One application for the reaction of modified polyimide surfaces with epoxy compounds is the attachment of an etch stop barrier for reactive ion etching. Attachment of a patterned layer of an epoxy-functional poly(siloxane), for example, will allow reactive ion etching to impact a pattern to the underlying polyimide for the purposes of constructing interconnection circuitry. Another application of the reaction with epoxy compounds pertains to adhesion of the polyimide to other materials. Epoxy compounds are well known for their excellent adhesion to a variety of materials, while polyimides generally have poor adhesion. By attaching a thin layer of epoxy to the surface of polyimide, the desirable bulk properties of polyimide are matched to the excellent adhesive properties of epoxies.

The various hydrazine compounds that may be employed according to the present invention comprise hydrazine as well as a substituted hydrazine of the formula:

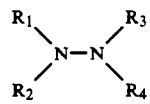

where R1 is alkyl, cycloalkyl, aryl, alkaryl, aralkyl, alkoxy, aryloxy or nitrogen containing heterocyclic radical and R2, R3 and R4 are hydrogen or the same as R1, and at least one of $R_1$, $R_2$, $R_3$, $R_4$ is hydrogen, said alkyl radicals including the alkyl portion of the alkaryl radical, cycloalkyl and aralkyl and alkoxy radicals containing from one to about ten carbon atoms including the isomeric configurations thereof, the ring structure of said cycloalkyl, aryl, alkaryl, aralkyl, aryloxy and heterocyclic radicals containing from 3 to about 17 carbon atoms including fused ring structures.

The various hydrazines and hydrazine compounds that may be employed in this respect are further defined in Kirk-Othmer (supra) Volume 12 pp. 734–771 which is incorporated herein by reference.

Reactions of the modified polyimide surface with hydrazines and hydrazine compounds provide for further transformations of the surface which are useful in promoting adhesion to other materials. These reactions are also useful in attaching sites for further reactions, such as reactions with epoxy compounds.

The various hydroxy-functional compounds that may be reacted according to the present invention comprise those alcohols having from one to about ten carbon atoms including the aliphatic, alicyclic, saturated and unsaturated alcohols the various isomers thereof and the various substituted alcohols thereof known in the art such as the 1–10 carbon atom aliphatic alcohols and the various isomers thereof, fluorinated alcohols such as an aliphatic fluorinated alcohols having up to about 10 carbon atoms and contain from one fluorine up through the perfluorinated configuration and include trifluoroethanol, cyclohexyl alcohols, benzyl alcohol, the acetylenic alcohols such as propargyl alcohol; butyne diol; hydroxyethyl propargyl ether; bis(hydroxyethoxy)-butyne; 2-hydroxypropyl-butynyl ether; hexyne diol; 2-methyl-3-butyn-2-ol; 3-methyl-1-pentyn-3-ol; 3,4-dimethyl-1-pentyn-3-ol; 2-ethyl-1-pentyn-3-ol; 3-isopropyl-4-methyl-1-pentyn-2-ol; 3-methyl-1-hexyn-2-ol; 3- isopropyl-4-methyl-1-pentyn-3-ol; 3-methyl-1-hexyn-3-ol; 3-propyl-1-hexyn-3-ol.

It has been found, in the case of reacting alcohols with the surface carboxyl groups formed on the polyimides that the reaction precedes by first ionizing the carboxyl group with an amine such as triethylamine followed by the reaction of the alcohol in combination with an alkyl chloroformate such as ethyl chloroformate.

Although ethyl chloroformate is readily employed in this aspect of the invention, any alkyl halo formate may be employed where the alkyl group has up to about 5 carbon atoms and the halo group comprises chlorine, bromine or iodine. Similarly, triethylamine is a preferred amine for conducting this reaction of the invention although other tertiary amines may be employed. Equivalent amines may also be employed for the trialkyl amines and are known in the art. Examples of other alkylhaloformates include methyl chloroformate, propyl chloroformate and butyl bromoformate. Other tertiary amines include trimethylamine, benzyldimethylamine, and N-methylmorpholine.

Surface esterification of a polyimide has a number of applications. It is known in the art that adhesion of polyimide films to other materials and to a second polyimide film can be enhanced by hydrolysis of the surface to give amic acid groups. Esterification of the surface provides a less reactive surface for a less corrosive interaction with metals. Surface esterified polyimide also will be re-imidized more slowly than the amic acid and thus will provide a greater opportunity for adhesive interactions at the interface between two laminated polyimide films.

Surface esterification is also useful in connection with methods of applying metal circuitry to polyimide. To achieve optimum adhesion between the metal, e.g. copper, to be applied by electroless deposition, it is desirable to control the depth to which the palladium seed is deposited in the film (See for example, A. Viehbeck et al., "Method for Conditioning a Polymer Surface," U.S. Pat. No. 07/290,486 filed Dec. 23, 1988). By esterifying the surface, a thin layer of material is obtained which is unreactive with the palladium ions. This thin layer ensures that the seed is deposited some distance into the polyimide and enhances the adhesion of the subsequently deposited copper. In the absence of the esterified layer, in some cases the palladium seeds are deposited just at the surface and adhesion of copper is poor.

A further use for surface esterification is in controlling the density of carboxylic acid groups on the surface. By esterification of a fraction of the carboxylic acid groups, the density of remaining carboxylic acid groups can be varied. By using these remaining acid groups as sites for surface grafts, for example, control is achieved over the density of surface grafts.

Organic reactions in solution are not easily extended to polymer surfaces for a number of reasons. First, the amount of reactive groups on a polymer surface is many times smaller than even the most dilute solution of a compound containing similar groups. The difference in amount places stringent requirements on purity of the reagents because the most minor impurity, if sufficiently reactive, can preferentially react with the surface groups to give an undesired reaction. Second, reactions must be chosen to give quantitative conversion of the surface groups to avoid complications from competitive reactions. Also, the reactions should not cause by-products to be precipitated on the surface, contaminating it for further reactions or preventing the desired surface property from being obtained. Third, reaction conditions must be mild enough to avoid reorganization of the surface, or i.e. incorporation of the surface groups in the bulk polymer, exposing unmodified polymer at the surface, or degradation of the molecular weight or polymer chain bonds. Temperature excursions or exposure of the surface to plasticizing solvents can cause surface re-organization. These considerations taken together imply that no solution reaction can be expected to work on a polymer surface without due care and thorough experimentation.

In that aspect of the invention which employs a redox-mediated process to deposit catalytic seed for electroless plating, the first step involves reacting a surface region of an electroactive material such as a polyimide by any process that will cause this region to be more difficult or unable to reduce (i.e. accept electrons from a reducing bath). The surface region can be small or include hundreds of monolayers of polymer. The ideal treatment of the surface involves a "wet chemical" reaction since chemical treatments are typically low cost, high through-put processes as compared to high vacuum techniques such as plasma or corona discharge treatment of the surface of the electroactive material. High vacuum techniques such as reactive ion bombardment, may also be useful to change the redox properties of the electroactive material such as the polyimide. In a preferred embodiment, polyimides are subjected to a ring opening reaction preferably by a primary amine or by means of a hydroxide ion such as the alkali metal hydroxides described herein followed by neutralization. Where the hydroxide ion is employed followed by neutralization to remove the alkali metal ion, the carboxylic acid group of the amic acid imide produced may be esterified according to the other method of the present invention in order to eliminate the cation-exchange properties of the polyamic acid. The surface is thus prepared either by the treatment of the polyimide by a primary amine or by a hydroxide ion as specifically described—including optional esterification. When the polymer is immersed in a reducing solution, chemical reduction occurs selectively beneath the modified, non-reduction layer. Upon exposure to a seed solution, which typically contains a palladium (II) salt, polyimide-to-metal electron transfer occurs resulting in the deposition of metallic palladium beneath the polymer surface. This metallic palladium is available for catalyzing an electroless copper solution containing an aldehyde, the palladium acting to catalyze the reducing properties of the aldehyde and thereby convert the copper salt into copper metal by an electroless process. It has been found that the electroless copper or electroless metal thus deposited is anchored into the film and forms a copper or metal polymer mix at the surface of the treated polyimide and extending beneath such surface. The deposited copper or deposited metal component may be subsequently used as an electrical conductor or employed to build a film by an electrolytic coating process well known in the art.

This aspect of the invention resides in the discovery that by reacting a surface region of an electroactive material such as a cured polyimide by any process that will cause the region to be more difficult to reduce (i.e. accept electrons from a reducing bath), the sub-surface can be selectively reduced. Because the metal ions must diffuse through the modified surface region to the reduced sub-surface region before being reduced, a high degree of control of the location of the deposited metal seeds is possible. This control can be very important for optimizing adhesion of the subsequently deposited copper. Thus by opening the ring structure of a polyimide, the reduction potential becomes significantly more negative than the parent imide moiety. This aspect of the invention differs from the prior art process of applying metal particles such as palladium to a polyimide surface where the polyimide surface is chemically reduced.

After seeding with an electroless metal catalyst such as palladium, thermal treatment may be desirable in order to reimidize the reacted surface region of the polymer. In the case in which amines are used to modify the surface, primary amines having the formula $RNH_2$ where R represents a nonspecific organic group may be employed, or other amines may also be used such as ethylene diamine and other polyamines as well as amines that also contain a functional group that can coordinate to Ni(0) or Cu(0), these groups providing chemical bonding in addition to mechanical interlocking as the electroless metal deposits beneath the surface grows through the modified layer. Olefin and phosphine-containing chemical species may be also be employed for chemical surface modification that would provide metal chelating sites for improving chemical bonding forces at the polymer/metal interface.

The various amines suitable for the purposes of the invention are described and defined in Kirk-Othmer, supra., Vol. 2, pp. 272-376 which is incorporated herein by reference. Examples of some unsaturated amines that may be used in this respect comprise 4-diethylamine-2-butyne-1-ol; (N-methyl)propargylamine; 1-di(N)ethyl amino-2-propyne; 4-diethylamine-1-butyne-1 and 6-bis(-morpholino)-2-hexyne.

Other possible methods for modifying polyimide surfaces include electrophilic and nucleophilic reaction of the reduced forms of polyimides as described in U.S. patent application Ser. No. 07/381,552 filed July 18, 1989 and unfiled patent application attorney docket YO989-091 which are incorporated herein by reference.

In addition chemical or electrochemical reactions of the polyimide may be employed in such a manner so as to reduce one or more of the carbonyl groups to an alcohol or further reduction to eliminate the oxygen of the imide. An example of such a reaction is via reduction with metal hydrides such as lithium aluminum hydroxide or catecholborane, the latter reagent can selectively reduce the carboxylic acid group to a carbinol group. Additionally, a thin overcoat of a different polyimide or other material that is again more difficult to reduce than the underlying polyimide may also be employed where the coating is still permeable toward solvent and reducing agent.

The following examples are illustrative.

EXAMPLE 1

Films of polyamic acid (Du Pont Pyrclin) are spun or cast onto silicon wafers. The films are then imidized using a standard curing cycle. The wafers are immersed in an aqueous NaOH solution (10.3 g NaOH/1 L $H_2O$ for 60 minutes), washed with water and next immersed into an aqueous acetic acid (or hydrochloric acid) bath (50 mL $CH_3CO_2H$/1 L $H_2O$ for 60 minutes). Analysis of the modified surface by X-ray photoelectron spectroscopy (XPS) showed the desired modification had occurred. After drying, the films are ready for any other chemical modification desired.

EXAMPLE 2

The carboxyl groups of the polyamic acid of Example 1 are reacted with epoxides to form esters. This type of reaction was examined on the carboxylic acid-rich surface of the modified polyimide. A solution of Epon 828 (Shell Chemical Co., diglycidyl ether of bisphenol A) in methylisobutyl ketone was cast onto a modified polyimide. The solvent was removed by heating at 80° C. for thirty minutes. The sample was then heated to 120° C. for two hours to cause the esterification reaction. After rinsing off the excess epoxy, XPS data revealed that the epoxy had indeed been grafted onto the polyimide surface.

EXAMPLE 3

A reaction of 2-hydrazinopyridine was also used to attach a pyridine group to the modified polyimide surface in this example. The procedure used for grafting 2-hydrazinopyridine to the polyimide surface involved treatment of the film of Example 1 with a solution of the hydrazine in N-methyl-2-pyrrolidinone (NMP) (4.0 g 2-hydrazinopyridine/ 400 mL NMP) at 75°-90° C. for 55 minutes.

EXAMPLE 4

Pyridine is known to initiate polymerization of epoxides. The pyridine group attached in example 3 was used in this example to graft an epoxide to the polyimide surface. The technique used involved casting a solution of Epon 828 (25-50 weight % in methylisobutylketone) onto the modified surface. The solvent was removed by heating on a hot plate (80° C. for 30 minutes). The reaction of the epoxide linkage with the grafted hydrazinopyridine moiety was initiated on a hot plate (125° C. for 2 hours). The excess Epon 828 was removed by rinsing the sample with methylisobutylketone.

EXAMPLE 5

Solution reactions cannot always be adapted to reactions at the polyimide surface. Several unsuccessful attempts were made to react a surface-hydrolyzed film with an epoxysiloxane. A film was hydrolyzed in 0.25M NaOH, rinsed, treated with 1M acetic acid, rinsed in deionized water and dried overnight under vacuum over phosphorus pentoxide. It was immersed in triethylamine for 15 minutes, rinsed twice with methanol and once with methyl ethyl ketone, and immersed for 3.5 hours in a 1:1 by volume mixture of methyl ethyl ketone and epoxysiloxane PS404 (Petrach Systems, Inc.). It was then rinsed four times with methyl ethyl ketone. Water contact angles (67°-70° advancing) indicated that little or no reaction of the siloxane had occurred. Previous experience has shown that water contact angles greater than 90° are obtained on siloxane-covered surfaces.

EXAMPLE 6

The modified surface of polyimides can be used to enhance the adhesion of vapor-deposited metals. For example, polyimide films were prepared, from 1,2,3,4,5-benzenetetracarboxylic acid dianhydride and 4,4'-oxydianiline, and cured to 400° C. on glass substrates. The films were subjected to 2 hour hydrolysis with 0.250 M NaOH and 2 hour acidification with 0.10 M acetic acid. 200 A of chromium was deposited by electron beam evaporation followed by copper to a thickness of 2 m through a peel test mask with 2.0 mm wide lines. Several samples were prepared and copper was deposited, electrolytically from an acid copper bath, to a thickness of 30 and 19 m respectively. The adhesion of the lines was measure 90° peel test with a crosshead speed of 0.25 inch/min. The 30 m line was measured at 9.9±2.3 g/mm while that of the 19 m line was 4.2±1.7 g/mm. For comparison and under similar conditions the adhesion of chromium/copper to untreated polyimide was measured to be 1-2 g/mm.

EXAMPLE 7

The surface hydrolysis carried out in this example results in no obvious change in the XPS spectra, which is consistent with analysis of partly cured polyamic acid films. A technique that has been used for XPS monitoring of curing of such films was applied here. The films of example 1 were treated with trifluoroacetic anhydride (TFA) in pyridine which reacts only with the amic acid groups and not with the imide species, forming an isoimide. The N1s peaks of imide and isoimide are separated by 1.5 eV, while the imide and amic acid N1s peaks are separated only by about 0.6 eV (too small a difference to detect in XPS). Table 1 shows the nitrogen 1s data before (Ex. 1A and 1B) and after the TFA treatment.

TABLE 1

| Nitrogen 1s Data for Films of Example 1. | | |
|---|---|---|
| Sample | 401.0 | 399.6 eV |
| Ex. 1A | 100 | |
| Ex. 1A + TFA | 87 | 13 |
| Ex. 1B | 100 | |
| Ex. 1B + TFA | 63 | 37 |

From the data it is clear that the film from Ex. 1A was hydrolyzed by at least 13%, while that from Ex. 1B was hydrolyzed by at least 37% (TFA treatment is not quantitative—a small amount of imide is also formed during the reaction although the primary product is isoimide). It is important to note that within the sampling depth of the XPS experiment (ca.50 A ), there remains in both cases appreciable unaffected imide. This result shows that the hydrolysis is in fact confined to the surface as desired assuming uniform modification (hydrolysis) across the surface.

EXAMPLE 8

The grafting of epoxy to the polymer surface results in significant changes in the XPS spectra, as expected.

TABLE 2

| XPS Oxidation State Data for Films of Example 2. | | | | | | | |
|---|---|---|---|---|---|---|---|
| | Carbon 1s | | | | Oxygen 1s | | Nitrogen 1s |
| Sample | 285.0 | 286.0 | 286.9 | 289.2 | 532.8 | 533.8 | 401.0 | 399.3 |
| Ex. 2A | 49 | 22 | 22 | 7 | 60 | 40 | 100 | |
| Ex. 2B | 52 | 19 | 25 | 4 | 50 | 50 | 100 | |
| Control | 45 | 42 | — | 14 | 70 | 30 | 93 | 7 |
| Epoxy wash | 48 | 39 | — | 14 | 65 | 35 | 93 | 7 |

The data shows that the epoxy does not react with the cured polyimide surface without prior surface treatment; there is no significant difference between the epoxy wash sample and the control, or untreated film. The two samples subjected first to the surface hydrolysis conditions, however, show significant changes consistent with incorporation of epoxy on the films. The two samples 2A and 2B differ only in the length of time of hydrolysis, and the results show the expected increase in the extent of modification for 2B.

EXAMPLE 9

The reaction of the modified surface with 2-hydrazinopyridine (HYPY) is evidenced by the effect on the N1s part of the XPS spectrum in Ex. 3 (Ex. 1=NaOH+HCl, Ex. 3=NaOH+Hcl+HYPY, Ex. 4=NaOH+HCl+HYPY+EPOXY)

TABLE 3

| XPS Oxidation State Data for Films of Example 3. | | | | | | | | |
|---|---|---|---|---|---|---|---|---|
| | Carbon 1s | | Nitrogen 1s | | Oxygen 1s | | Chlorine 2P | |
| Sample | 285.0 | 286.1 | 288.8 | 400.9 | 399.5 | 532.4 | 533.8 | 200.9 |
| Ex. 1 hydrolyzed surface | 48 | 38 | 14 | 100 | — | 64 | 36 | — |
| Ex. 3 hydrolyzed + HYPY | 51 | 37 | 12 | 87 | 13 | 69 | 31 | — |
| Ex. 4 hydrolyzed + HYPY + EPOXY | 60 | 34 | 6 | 100 | — | 51 | 49 | 100 |

We have also shown that the HYPY bonding to the treated polyimide surface is thermally stable, by exposing the Example 3 film sample to another polyimide cure cycle (400° C. for 30 min in nitrogen). No change in the XPS data was observed.

EXAMPLE 10

Further reaction of the surface modified in Example 3 was performed with epoxy resin. Confirmation of this reaction was obtained both from the elemental composition (Table 4), especially the small amount of chlorine which can be attributed to the epoxy, and from the change in oxidation state data (Table 3).

TABLE 4

| Elemental Composition after Various Treatments. | | | | | |
|---|---|---|---|---|---|
| Sample | Description | C % | N % | O % | Cl % |
| Ex. 1A | NaOH + HCl | 75 | 7 | 18 | — |
| Ex. 1B | NaOH + HCl | 75 | 7 | 18 | — |
| Ex. 3 | NaOH + HCl + HYPY | 77 | 8 | 15 | — |
| Ex. 4 | NaOH + HCl + HYPY + EPOXY | 79 | 4 | 16 | 0.3 |
| Control | | 77 | 7 | 16 | — |

EXAMPLE 11

The polyimide of Example 1 having surface carboxyl groups was reacted with triethylamine to form an amine salt of the carboxyl group. This reaction was carried out in neat triethylamine at room temperature for 15 minutes. The film was then reacted with a mixture of ethylchloroformate, ethanol and additional triethylamine (ratio of 48/48/4 by volume) at room temperature for 1-2 hours to form a ethyl ester of the carboxyl group on the surface of the film.

XPS data was obtained for the esterified surface as follows:

| XPS DATA FOR ESTERIFIED SURFACE | | |
|---|---|---|
| Reference spectra | | |
| C1s | O1s | N1s |

-continued

| XPS DATA FOR ESTERIFIED SURFACE | | | | | | | |
|---|---|---|---|---|---|---|---|
| | 285.0 | 286.1 | 288.1 | 289.3 | 532.1 | 533.8 | 400.4 |
| Ester | 38.5 | 46.5 | 7.6 | 7.6 | 57.1 | 42.9 | 100.0 |
| calculated | 53 | 32 | 8 | 7 | 53 | 47 | 100 |
| experimental | | | 288.9 | | 532.4 | | 400.9 |
| Imide | 36.4 | 45.4 | 18.2 | | 80.0 | 20.0 | 100.0 |
| calculated | 43 | 43 | 14 | | 75 | 25 | 100 |
| experimental | | | | | | | |

| | Esterified Surface | | | | | | |
|---|---|---|---|---|---|---|---|
| | C1s | | | | O1s | | N1s |
| experimental | 285.0 | 286.0 | 288.5 | 289.3 | 532.0 | 533.7 | 400.5 402.1 |
| | 47 | 35 | 8 | 5 | 49 | 51 | 89 11 |

EXAMPLE 11

Films of Kapton (trademark) where immersed in an aqueous solution containing 7.5% (w/w) ethylene diamine at times varying form 5 to 15 minutes. The films were then immersed in a reducing bath consisting of 0.05N benzil and 0.1M tetraethylammonium tetrafluoroborate in acetonitrile. The benzil was approximately 10% reduced. Samples exposed for greater than two minutes to the ethylene diamine solution showed an induction period for polymer reduction which is easily monitored by the yellow to green color change in the film to the radical-anion form. The longer the treatment, the longer the induction period for reduction. This is clear evidence that an electron-transfer barrier region has been generated at the polymer/solution interface. The samples were seeded by exposure to a 5 mM solution of palladium chloride in acetonitrile and rinsed with neat acetonitrile. Electroless copper was deposited by immersion in a standard formaldehyde-based bath for 2.5 minutes. This conductive strike layer of electroless copper allowed for further electrolytic copper deposition to a one mil thickness. The samples thus obtained were heated in a vacuum oven at 80° C. for two days and the adhesion measured using a standard 90° peel test and the results presented graphically in the drawing. The metal-to-polyimide adhesion for untreated Kapton (trademark) starts at approximately 6 to 8 g/mm. The adhesion increases with increasing treatment time and levels off at about 30 g/mm by 10 min. of reaction time. Further treatment results in no further adhesion improvement. These data indicate clear adhesion improvements for the chemically treated films.

By employing the foregoing processes, a wide variety of packaging structures can be produced in which the surface modification offers distinct advantages including low cost, no effect on bulk properties of the polyimide and generally provides a versatile surface modification of the polyimide which can be tailored to enhance adhesion to a variety of materials.

The process of the invention is typically applicable in flex circuitry, tape automated bonding (TAB), high density polyimide circuit cards and multi-chip modules and parallel processing of thin film circuitry.

Although the invention has been described by reference to certain embodiments, it is not intended that the process disclosed herein be limited thereby but that modifications thereof are intended to be included as falling within the broad scope and spirit of the foregoing disclosure and the following claims.

Having thus described our invention, what we claim as new, and desired to secure by letters patents is:

1. A process comprising
   (a) hydrolyzing the surface of an imide containing polymer to form free carboxyl groups, thereon said hydrolyzing being conducted to leave sufficient polyimide groups in said polymer so that said polymer substantially retains its structural integrity after said hydrolysis:
   (b) reacting said carboxyl groups with a compound consisting essentially of:
      (i) an epoxy compound;
      (ii) a hydrazine compound;
      (iii) an alcohol compound to obtain a product.

2. The process of claim 1 where said epoxy compound is a room temperature solid, a liquid epoxy resin, a epoxidized oil or a monomolecular organoepoxy compound having from 3 to about 15 carbon atoms, said monomolecular epoxy compounds including cyclic epoxies, aromatic epoxies, heterocyclic nitrogen containing epoxies or aliphatic epoxies.

3. The process of claim 1 where said epoxy compound is:
   epichlorohydrin;
   ethylene oxide;
   propylene oxide;
   butylene oxide;
   cyclohexene oxide;
   cyclopentene oxide;
   styrene oxide;
   triglycidyl isocyanurate;
   epoxidized oil;
   hydantoin epoxy resins;
   bisphenol A or bisphenol F reaction products with epichlorohydrin;
   epoxy cresol novolacs;
   epoxy phenol novolacs;
   polynuclearphenol-glycidyl ether-derived resins;
   cycloaliphatic epoxy resins;
   tetraglycidylmethylenedianiline resins;
   triazine epoxy resins;
   and triglycidyl-p-aminophenol resins to obtain a product.

4. The process of claim 1 where said hydrazine compound is selected from hydrazine or a substituted hydrazine of the formula:

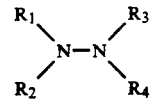

where R1 is alkyl, cycloalkyl, aryl, alkaryl, aralkyl, alkoxy, aryloxy or nitrogen containing heterocyclic radical and R2, R3 and R4 are hydrogen or the same as R1, and at least one $R_1$, $R_2$, $R_3$, $R_4$ is hydrogen, said alkyl radicals including the alkyl portion of the alkaryl radical, cycloalkyl and aralkyl and alkoxy radicals containing from one to about ten carbon atoms including the isomeric configurations thereof, the ring structure of said cycloalkyl, aryl, alkaryl, aralkyl, aryloxy and heterocyclic radicals containing from 3 to about 17 carbon atoms including fused ring structures to obtain a product.

5. The process of claim 1 where said carboxyl groups are reacted within an aliphatic alcohol including substituted aliphatic alcohols.

6. The process of claim 4 further comprising reacting said product with an epoxy compound.

7. A product obtained by the process of claim 2.
8. A product obtained by the process of claim 3.
9. A product obtained by the process of claim 4.
10. A product obtained by the process of claim 5.
11. A product obtained by the process of claim 8.
12. A process comprising applying to the surface of an imide containing polymer an amine or caustic material to obtain a surface treated imide containing polymer, said surface being more difficult to reduce than the starting imide containing polymer and;
    contacting said surface with a reducing solution so that chemical reduction occurs selectively beneath the surface of said treated imide.
13. The method of claim 12 which includes contacting said surface with a metal ion that will penetrate said surface and be reduced in the underlying imide containing polymer, so that said metal ions will be reduced and metal will be deposited at some depth beneath said surface, where said metal ion is selected to catalyze an electroless metal coating.
14. The method of claim 13 where said metal ion is a Group VIII metal.
15. The method of claim 13 further comprising the step of applying an electroless metal coating to said treated imide containing polymer that has been contacted with said metal ion.
16. The method of claim 15 where said electroless metal coating is copper, gold, nickel or cobalt.
17. The method of claim 15 further comprising the step of electrolytically depositing a metal coating on said electroless metal coating.
18. The method of claim 17 where said electrolytic metal coating is copper, gold, nickel or cobalt.
19. The method of claim 5 where after treatment with said alcohol, a surface treated imide containing polymer is obtained said surface being more difficult to reduce than said imide containing polymer having free carboxyl groups and;
    contacting said surface with a reducing solutions so that chemical reduction occurs selectively beneath the surface of said treated imide.
20. A method of claim 19 which includes contacting said surface with a metal ion that will penetrate said surface and be reduced in the underlying imide containing polymer, so that said metal ions will be reduced and metal will be deposited at some depth beneath said surface, where said metal ion is selected to catalyze an electroless metal coating.
21. The method of claim 20 where said metal ion is a Group VIII metal.
22. The method of claim 20 further comprising the step of applying an electroless metal coating to said treated imide containing polymer that has been contacted with said metal ion.
23. The method of claim 22 where said electroless metal coating is copper, gold, nickel or cobalt.
24. The method of claim 22 further comprising the step of electrolytically depositing a metal coating on said electroless metal coating.
25. The method of claim 24 where said electrolytic metal coating is copper, gold, nickel or cobalt.
26. A product obtained by the process of claim 12.
27. A product obtained by the process of claim 13.
28. A product obtained by the process of claim 15.
29. A product obtained by the process of claim 17.
30. A product obtained by the process of claim 19.
31. A product obtained by the process of claim 20.
32. A product obtained by the process of claim 22.
33. A product obtained by the process of claim 24.

* * * * *